(12) United States Patent
Gerber (10) Patent No.: US 6,794,862 B2
(45) Date of Patent: Sep. 21, 2004

(54) MAGNETIC THIN FILM SENSOR BASED ON THE EXTRAORDINARY HALL EFFECT

(75) Inventor: Alexander Gerber, Tel Aviv (IL)

(73) Assignee: Ramot at Tel-Aviv University Ltd., Tel Aviv (IL)

( * ) Notice: Subject to any disclaimer, the term of this patent is extended or adjusted under 35 U.S.C. 154(b) by 0 days.

(21) Appl. No.: 10/141,522

(22) Filed: May 7, 2002

(65) Prior Publication Data

US 2002/0180429 A1 Dec. 5, 2002

Related U.S. Application Data

(60) Provisional application No. 60/289,427, filed on May 8, 2001.

(51) Int. Cl.[7] .......................... G01R 33/07; G01R 33/06
(52) U.S. Cl. ..................................... 324/251; 338/32 H
(58) Field of Search ................................ 324/235, 251, 324/207.2; 338/32 H; 360/112

(56) References Cited

U.S. PATENT DOCUMENTS

| | | | |
|---|---|---|---|
| 4,393,427 A | | 7/1983 | Sakurai ..................... 360/112 |
| 4,420,781 A | | 12/1983 | Sakurai ..................... 360/112 |
| 4,782,705 A | * | 11/1988 | Hoffmann et al. ............. 73/776 |
| 5,206,590 A | | 4/1993 | Dieny et al. ................. 324/252 |
| 5,361,226 A | | 11/1994 | Taguchi et al. ............. 365/171 |
| 5,617,071 A | | 4/1997 | Daughton et al. ........ 338/32 R |
| 5,652,445 A | | 7/1997 | Johnson ...................... 257/295 |
| 6,579,728 B2 | * | 6/2003 | Grant et al. .................... 438/3 |
| 6,613,448 B1 | * | 9/2003 | Akinaga et al. ............ 428/611 |

FOREIGN PATENT DOCUMENTS

JP          09022509 A  *  1/1997  ............ G11B/5/39

OTHER PUBLICATIONS

Ryzhanova et al., Quasiclassical size effect for the extraordinary Hall effect in magnetic sandwiches, Physical Review B, vol. 57, No. 5, Feb. 1, 1998, pp. 2943–2949.*

Canedy et al., Large magnetic moment enhancement and extraordinary Hall effect in CO/Pt superlattices, Physical Review B, vol. 62, No. 1, Jul. 1, 2000, p. 508–519.*

Gerber et al; Spin– dependent scattering in weakly coupled nickel films, Europhysics Letters (Feb. 1, 2000) vol. 49, No. 3, p. 383–9.*

Gerber, et al. "Spin–dependent scattering in weakly coupled nickel films", Europhysics Letters, 49(3), 2000.

US Provisional Application Ser. #60/289,427 Filed May 8, 2001.

* cited by examiner

Primary Examiner—N. Le
Assistant Examiner—Darrell Kinder
(74) Attorney, Agent, or Firm—Ladas & Parry

(57) ABSTRACT

A magnetic field sensor, including an insulating substrate and a conductive thin film deposited on the substrate. The thin film consists of a material having an extraordinary Hall coefficient, the thin film also has a resistivity and a film thickness no greater than a threshold thickness at which the resistivity is substantially equal to 150% of a bulk resistivity of the material. The sensor also includes conductors coupled to the thin film for injecting a current into the film and measuring a voltage generated across the thin film responsive to the injected current. Devices having other types of thin films, including homogeneous and non-homogeneous films, the films having enhanced extraordinary Hall coefficients, are also provided.

10 Claims, 4 Drawing Sheets

MAGNETIC THIN FILM SENSOR BASED ON THE EXTRAORDINARY HALL EFFECT

CROSS-REFERENCE TO RELATED APPLICATION

This application claims the benefit of U.S. Provisional Patent Application No. 60/289,427, filed May 8, 2001, which is incorporated herein by reference.

FIELD OF THE INVENTION

The present invention relates generally to magnetic field sensors, and specifically to sensors formed from thin films.

BACKGROUND OF THE INVENTION

A method well known in the art for measuring magnetic field is to utilize the Hall effect, which generates an electrical potential in a conductive material. The potential generated is directly dependent on an electric current flowing in the material and on the magnetic field perpendicular to the current.

Figure 1:
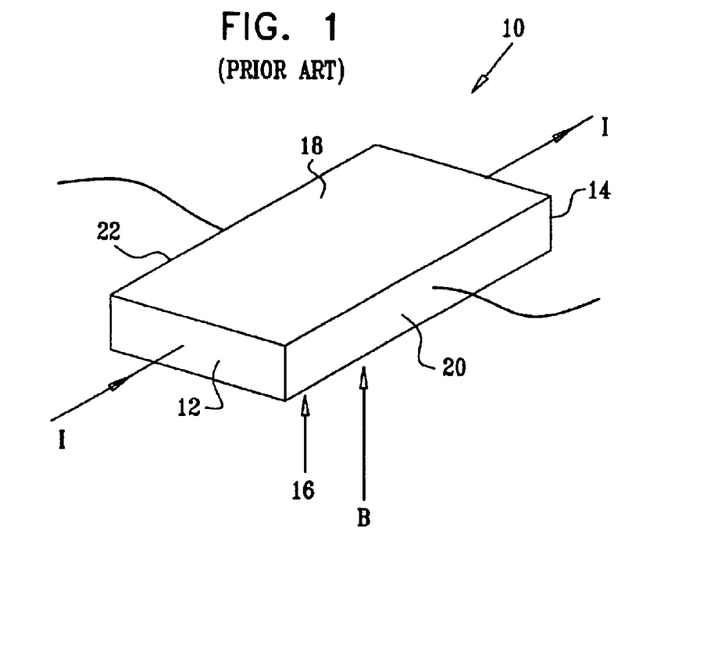
FIG. 1 is a diagram of a ferromagnetic conductor having a general rectangular film-like shape, as is known in the art.

FIG. 1 is a diagram of a ferromagnetic conductor 10, having a general rectangular film-like shape, as is known in the art. Conductor 10 has a current I flowing between faces 12 and 14 of the conductor, and there is a magnetic field B applied through faces 16 and 18 of the conductor, causing a magnetization M in the conductor. Face 16 (or 18) defines a plane of conductor 10. Field B acts on moving current carriers in conductor 10 to generate a Hall voltage $V_H$ between faces 20 and 22 of the conductor. In general:

$$V_H = I \cdot (R_n \cdot B + R_e \cdot M) \quad (1)$$

where $R_n$ is a first constant, termed the normal Hall coefficient, and $R_e$ is second constant, termed the extraordinary Hall coefficient, for conductor 10.

The normal Hall coefficient, $R_n$, represents the effect of Lorentz forces on the current carriers in conductor 10. The extraordinary Hall coefficient $R_e$, characteristic of conductors which are ferromagnetic, represents the effect of scattering of electrons in the presence of magnetic polarization. In bulk ferromagnetic materials, $R_e$ can be much larger than $R_n$, so that for values of B lower than those saturating conductor 10, equation (1) can be rewritten as:

$$V_H = I \cdot R_e \cdot M = I \cdot R_e \cdot \chi B \quad (2)$$

where $\chi$ is an effective susceptibility, dependent on the geometry and composition, of conductor 10.

Figure 2:
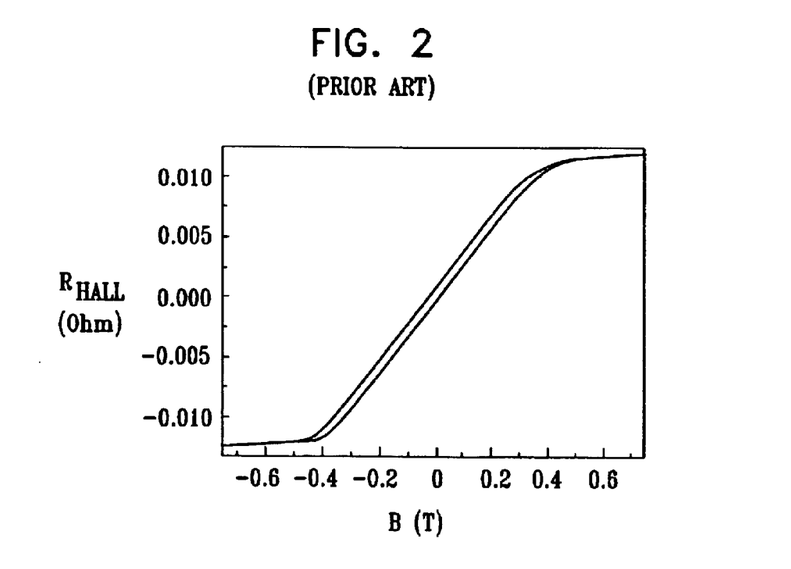
FIG. 2 is a graph illustrating a relation between a measured Hall resistance $R_{Hall}$ and magnetic field B at room temperature, as is known in the art.

FIG. 2 is a graph, as is known in the art, illustrating a relation between a measured Hall resistance $R_{Hall}$ and magnetic field B at room temperature, for a nickel film having a thickness of 100 nm. $R_{Hall}$ corresponds to the term $R_e \cdot \chi B$ of equation (2). The graph shows that in a region between −0.3 T and 0.3 T $R_{Hall}$ varies approximately linearly with magnetic field, that the slopes of the linear sections, $$\frac{dR_{Hall}}{dB},$$

are approximately 30 mΩ/T, and that there is a hysteresis of approximately $1.1 \cdot 10^{-2}$ T. The term $$\frac{dR_{Hall}}{dB}$$

is termed the field sensitivity, F, of the film.

From equation (2), and the definitions Hall resistance $R_{Hall}$ and of field sensitivity F, $$R_{Hall} = R_e \cdot \chi \cdot B, \text{ so that } \frac{dR_{Hall}}{dB} = F = R_e \cdot \chi \quad (3)$$

Returning to FIG. 1, a sensitivity S of conductor 10, when it is used as a ferromagnetic Hall sensor, may be defined as $$\frac{V_H}{B},$$

so that from equations (2) and (3):

$$S = \frac{V_H}{B} = I \cdot \chi \cdot R_e = I \cdot F \quad (4)$$

For Hall sensors which are not ferromagnetic, such as semiconductors, equation (1) becomes:

$$V_H = I \cdot R_n \cdot B \quad (5)$$

A sensitivity S, from equation (5), may be written as:

$$S = \frac{V_H}{B} = I \cdot R_n \quad (6)$$

Hall sensors using both ferromagnetic and non-ferromagnetic materials, the latter typically being semiconductors, are known in the art. Typically, an effective Hall coefficient for a bulk ferromagnetic, $\chi \cdot R_e$, is significantly smaller than the Hall coefficient, $R_n$, of a semiconductor.

A relationship between the extraordinary Hall coefficient $R_e$ and the resistivity ρ of ferromagnets is known in the art. The relationship is of the form:

$$R_e \propto \rho^n \quad (7)$$

where n is a constant.

The value of n in equation (7) is dependent on the composition of the ferromagnet, and typically lies in a range between 1 and approximately 4. Variations of ρ of the order of ten percent are typically produced by doping or temperature changes.

Ferromagnetic conductors such as conductor 10 may be implemented in one of two anisotropic forms. Planar anisotropy, wherein a direction of easy magnetization of the conductor lies in the plane of the conductor, and perpendicular anisotropy, wherein the direction of easy magnetization is perpendicular to the plane of the conductor. As known in the art, both forms exhibit some hysteresis, although the hysteresis of conductors which have perpendicular anisotropy is typically larger than the hysteresis of planar anisotropy conductors. Films with reduced thickness typically have planar anisotropy, although perpendicular anisotropy is known in such films, and in certain alloys, such as Co—Pt, Co—Cr, and Co—Cr—Ta. The implementation of conductor 10 as a planar or as a perpendicular anisotrope is typically a function of how conductor 10 is formed, and the composition of the conductor, as is known in the art.

An article titled "Spin-dependent scattering in weakly coupled nickel films," by Gerber et al., in *Europhysics Letters*, 49(3), (2000), which is incorporated herein by reference, describes a process of forming thin films from ferromagnetic materials. Initially, as films are formed on an insulating substrate by electron beam evaporation or radio-frequency sputtering, islands of metal build on the substrate. The process of island formation continues until a conductance percolation threshold is achieved, wherein there is a conducting path through the film between weakly coupled islands of the film. If deposition of the ferromagnetic material continues, a ferromagnetic percolation threshold is achieved, wherein the film becomes ferromagnetic. Between the conductance percolation threshold and the ferromagnetic percolation threshold the film behaves substantially as a super-paramagnetic.

It will be appreciated that the conductance percolation threshold may be evaluated for substantially any film of conducting material, for example, by determining during formation of the film a point at which the film begins to conduct. Similarly, the ferromagnetic percolation threshold may be evaluated for substantially any film of ferromagnetic material, for example, by determining during formation of the film the point at which the film begins to behave as a ferromagnet. Alternatively or additionally, the conductance percolation threshold may be evaluated by indirect measurement of conductance of the film, and the ferromagnetic percolation threshold may be evaluated by determining the presence of hysteresis in the film. Other methods for determining both thresholds will be apparent to those skilled in the art.

U.S. Pat. No. 4,393,427, to Sakurai, whose disclosure is incorporated herein by reference, describes a magnetic detecting head comprising a Hall element. The Hall element is an amorphous ferromagnetic film comprising a rare earth/transition metal alloy, and having a thickness of 200 nm or more. U.S. Pat. No. 4,420,781, to Sakurai, whose disclosure is incorporated herein by reference, also describes a magnetic detecting head comprising a Hall element having a thickness of about 150 nm.

U.S. Pat. No. 5,206,590, to Dieny, et al., whose disclosure is incorporated herein by reference, describes a magnetoresistive sensor comprising a first ferromagnetic film and a second ferromagnetic film separated by a non-magnetic metallic film. The sensor uses a "spin valve" effect occurring between the two ferromagnetic films, wherein the resistance between two uncoupled ferromagnetic layers varies as the cosine of the angle between magnetizations of the two layers.

U.S. Pat. No. 5,361,226, to Taguchi, et al., whose disclosure is incorporated herein by reference, describes a magnetic memory comprising a ferromagnetic film which has perpendicular anisotropy. One of the embodiments of the memory comprises a film having a thickness of 50 nm.

U.S. Pat. No. 5,617,071, to Daughton, whose disclosure is incorporated herein by reference, describes a magnetoresistive layered structure having a plurality of layers of ferromagnetic films. Providing multiple layers increases a "giant magnetoresistive" (GMR) response of the structure when it is used as a field sensor.

U.S. Pat. No. 5,652,445, to Johnson, whose disclosure is incorporated herein by reference, describes a hybrid Hall device. The device comprises a ferromagnetic film which is over-layered on a portion of a conductive layer. The device generates an electric signal responsive to a fringe magnetic field, from the ferromagnetic film, through the conductive layer.

Notwithstanding the systems described above, there is a need for a relatively simple magnetic field sensor which may be simply and robustly fabricated.

SUMMARY OF THE INVENTION

It is an object of some aspects of the present invention to provide a method and apparatus for sensing a magnetic field.

In some preferred embodiments of the present invention, a thin film comprising ferromagnetic material is implemented to have an enhanced extraordinary Hall effect. The enhancement is produced by forming the film so that electron scattering in the film is significantly larger than electron scattering of the bulk ferromagnetic material. Forming the film in this manner increases the electrical resistivity of the film, and thus increases the extraordinary Hall effect. The enhanced extraordinary Hall effect of the film enables the film to be used as an efficient magnetic field sensor.

The thin film is formed on a substrate, which acts as a mechanical support for the film, and the substrate may be any material which does not interfere with the operation of the film. The film is formed to have a film thickness no greater than a threshold thickness at which the resistivity is substantially equal to 150% of a bulk resistivity of the material thus achieving a corresponding enhanced extraordinary Hall effect. The enhanced extraordinary Hall effect of the thin film provides a corresponding enhancement in sensitivity of the sensor compared to unenhanced sensors, and using resistivity as a measure of the efficacy of the thin film substantially simplifies the process of fabricating the sensor.

The thin film is preferably formed by sputtering or electron beam deposition, or alternatively by any other method known in the art for producing thin films. The thin film may be implemented in a number of different forms:

- As a substantially homogeneous film of ferromagnetic material, such as cobalt or nickel.
- As a ferromagnetic matrix comprising insulating particles embedded within the matrix.

The thin film may also be implemented as a combination of the above forms.

In an alternative preferred embodiment of the present invention, the thin film is formed from weakly coupled ferromagnetic clusters. The thin film is implemented so that a thickness of the film is greater than that needed to achieve a conductance percolation threshold, but less than the thickness for the film to behave as a ferromagnetic, i.e., achieve a ferromagnetic percolation threshold. Within these thicknesses, the film is formed to have an increased resistivity, and thus an enhanced extraordinary Hall coefficient, compared to the bulk resistivity of the ferromagnetic.

In another alternative preferred embodiment of the present invention, the thin film is formed as a film comprising ferromagnetic particles embedded in a matrix of non-magnetic material. The thin film is implemented so that a volume ratio of the ferromagnetic particles to the non-magnetic material lies between a lower and an upper value. The lower value is approximately 0.05%, the upper value corresponds to a volume ratio for the ferromagnetic percolation threshold for the thin film, which is typically in a range between approximately 15% and approximately 100%. Within these values, the film may have an enhanced extraordinary Hall coefficient, compared to the extraordinary Hall coefficient for the bulk ferromagnetic. This occurs, for example, for cobalt grains embedded in a platinum matrix, compared to bulk cobalt.

Thin films formed as described above have a number of desirable properties enabling them to operate efficiently as magnetic field sensors:

At temperatures approximating room temperature, the thin film behaves as if it had planar or no anisotropy, i.e., the thin film exhibits little or no hysteresis.

The signal generated by the thin film is highly linear with magnetic field.

The sensitivity of the thin film is orders of magnitude larger than that of bulk ferromagnets, and may be comparable to or higher than the sensitivity of semiconductor Hall devices.

In some preferred embodiments of the present invention, a protective layer is formed over the thin film. The protective layer preferably comprises any insulating material, such as silicon dioxide, which has properties enabling it to protect the thin film.

In a further alternative preferred embodiment of the present invention, the thin film, implemented by one of the methods described above, is fabricated to have substantially perpendicular anisotropy. The thin film has substantial hysteresis, and may thus be used as a memory device.

There is therefore provided, according to a preferred embodiment of the present invention, a method for producing a material with an enhanced extraordinary Hall coefficient, including:

determining a conductance percolation threshold for the material;

determining a first value of a characteristic of the material at the conductance percolation threshold;

determining a ferromagnetic percolation threshold for the material;

determining a second value of the characteristic of the material at the ferromagnetic percolation threshold; and fabricating the material so that the characteristic of the material lies between the first and the second values of the characteristic.

Preferably, the material includes a ferromagnet having weakly coupled grains.

Preferably, the method further includes forming the material as a thin film, wherein the characteristic of the material includes a thickness of the thin film.

Further preferably, the first value of the thickness is approximately 3 nm, and the second value of the thickness is approximately 100 nm, and the thin film consists of nickel.

Preferably, fabricating the material includes setting the thickness so that the thin film has substantially no hysteresis.

There is further provided, according to a preferred embodiment of the present invention, a magnetic field sensor, including:

an insulating substrate;

a conductive thin film deposited on the substrate, the thin film including a material having an extraordinary Hall coefficient, the thin film having a thickness lying between a first thickness of the thin film at which a conductance percolation threshold for the material occurs and a second thickness of the thin film at which a ferromagnetic percolation threshold occurs; and conductors coupled to the thin film for injecting a current into the film and measuring a voltage generated across the thin film responsive to the injected current.

Preferably, the thin film includes a ferromagnet having weakly coupled grains.

Further preferably, the first thickness is approximately 3 nm, and the second thickness is approximately 100 nm, and the ferromagnet consists of nickel.

Preferably, the thickness is set so that the conductive thin film has substantially no hysteresis.

There is further provided, according to a preferred embodiment of the present invention, a magnetic field sensor, including:

an insulating substrate;

a conductive thin film deposited on the substrate, the thin film including a material having an extraordinary Hall coefficient, the thin film having a resistivity and having a film thickness no greater than a threshold thickness at which the resistivity is substantially equal to 150% of a bulk resistivity of the material; and conductors coupled to the thin film for injecting a current into the film and measuring a voltage generated across the thin film responsive to the injected current.

Preferably, the thin film includes a substantially homogeneous film consisting of a ferromagnet.

Preferably, the film thickness is less than approximately 10 nm.

Alternatively or additionally, the film thickness is less than approximately 6 nm.

Preferably, the film thickness is no greater than the thickness at which the resistivity is substantially equal to 200% of the bulk resistivity.

Alternatively or additionally, the film thickness is no greater than the thickness at which the resistivity is substantially equal to 250% of the bulk resistivity.

Preferably, the film thickness is set so that the conductive thin film has substantially no hysteresis.

Preferably, the film is implemented to have substantially parallel anisotropy.

There is further provided, according to a preferred embodiment of the present invention, a magnetic field sensor, including:

an insulating substrate;

a conductive thin film deposited on the substrate, the thin film consisting of a material having an extraordinary Hall coefficient and including an array of insulating inclusions within a ferromagnetic matrix, the thin film having a resistivity and having a volume ratio of the insulating inclusions to the ferromagnetic matrix no less than a threshold volume ratio at which the resistivity is substantially equal to 150% of a bulk resistivity of the material; and conductors coupled to the thin film for injecting a current into the film and measuring a voltage generated across the thin film responsive to the injected current.

Preferably, the volume ratio of the insulating inclusions to the ferromagnetic matrix is sufficiently small so that the thin film is above a conductance percolation threshold.

Preferably, the insulating inclusions include silicon dioxide, and the ferromagnetic matrix consists of nickel, and the volume ratio is less than or equal to approximately 100%.

Preferably, the volume ratio is set so that the conductive thin film has substantially no hysteresis.

There is further provided, according to a preferred embodiment of the present invention, a memory, including:

a substrate; and a conductive thin film deposited on the substrate so as to be substantially perpendicularly anisotropic, the thin film consisting of a material having an extraordinary Hall coefficient and having a resistivity and a film thickness no greater than a threshold thickness at which the resistivity is substantially equal to 150% of a bulk resistivity of the material.

There is further provided, according to a preferred embodiment of the present invention, a magnetic field sensor, including:

an insulating substrate;

a conductive thin film deposited on the substrate, the thin film including ferromagnetic particles within a conducting non-ferromagnetic matrix, a volume ratio of the ferromagnetic particles to the matrix lying between a lower volume ratio approximately equal to 0.05% and an upper volume ratio at which a ferromagnetic percolation threshold is achieved; and conductors coupled to the thin film for injecting a current into the film and measuring a voltage generated across the thin film responsive to the injected current.

Preferably, the upper volume ratio lies in a range between approximately 15% and approximately 100%.

Further preferably, the ferromagnetic particles include cobalt particles, and the conducting non-ferromagnetic matrix includes platinum.

There is further provided, according to a preferred embodiment of the present invention, a method for producing a thin film with an enhanced extraordinary Hall coefficient, including:

determining a bulk resistivity for a material comprising the thin film; and fabricating the thin film so that the fabricated thin film has a resistivity and a film thickness no greater than a threshold thickness at which the resistivity is substantially equal to 150% of the bulk resistivity.

Preferably, fabricating the thin film includes fabricating the film thickness so that the thin film has substantially no hysteresis.

There is further provided, according to a preferred embodiment of the present invention, a method for producing a thin film with an enhanced extraordinary Hall coefficient, including:

determining a bulk resistivity for a ferromagnetic material included in the thin film; and fabricating the thin film as an array of insulating inclusions within a matrix including the ferromagnetic material, so that the fabricated thin film has a resistivity and so that a volume ratio of the insulating inclusions to the ferromagnetic matrix is no less than a threshold volume ratio at which the resistivity is substantially equal to 150% of the bulk resistivity of the ferromagnetic material.

Preferably, the volume ratio of the insulating inclusions to the ferromagnetic matrix is sufficiently small so that the thin film is above a conductance percolation threshold.

Preferably, the insulating inclusions consist of silicon dioxide, and the ferromagnetic matrix includes nickel, and the volume ratio is less than or equal to approximately 100%.

Preferably, the volume ratio is set so that the thin film has substantially no hysteresis.

There is further provided, according to a preferred embodiment of the present invention, a method for producing a thin film with an enhanced extraordinary Hall coefficient, including:

fabricating the thin film as an array of ferromagnetic particles within a conducting non-ferromagnetic matrix;

adjusting a volume ratio of the ferromagnetic particles to the matrix to be between a lower volume ratio approximately equal to 0.05% and an upper volume ratio at which a ferromagnetic percolation threshold is for the thin film is achieved.

Preferably, the upper volume ratio lies in a range between approximately 15% and approximately 100%.

Preferably, the ferromagnetic particles include cobalt particles, and the conducting non-ferromagnetic matrix includes platinum.

The present invention will be more fully understood from the following detailed description of the preferred embodiments thereof, taken together with the drawings, in which:

DETAILED DESCRIPTION OF PREFERRED EMBODIMENTS

Figure 3:
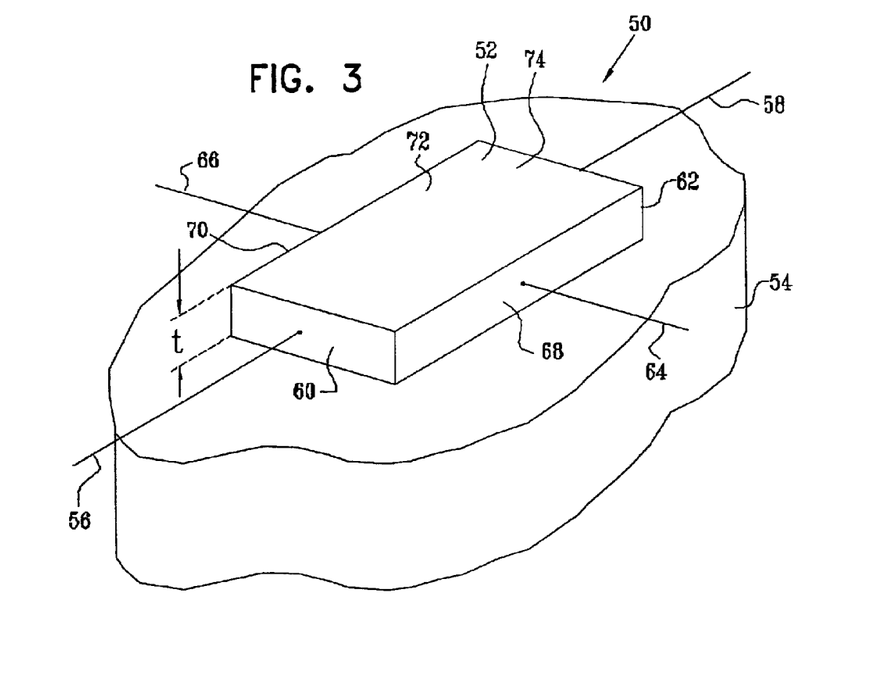
FIG. 3 is a schematic diagram of a magnetic field sensor, according to a preferred embodiment of the present invention.

Reference is now made to FIG. 3, which is a schematic diagram of a magnetic field sensor 50, according to a preferred embodiment of the present invention. Sensor 50 uses an enhancement to the extraordinary Hall effect to, inter alia, dramatically improve a sensitivity of the sensor to magnetic field compared to sensors known in the art. The enhancement, described in more detail below, is at least in part due to surface scattering. An article titled "Effect of surface scattering on the extraordinary Hall coefficient in ferromagnetic films," by Gerber et al., in *Physical Review B*, 65, 054426 (2002), which is incorporated herein by reference, describes surface scattering in different types of thin films.

Sensor 50 comprises a thin ferromagnetic layer 52 which is formed on a substrate 54. Layer 52 is implemented from a ferromagnetic material such as iron, cobalt, or nickel, or from a combination or an alloy of these elements, or from any other ferromagnetic material. Substrate 54 acts as a mechanical support for layer 52, and may be implemented from any material which does not interfere with the operation, described in more detail below, of layer 52. Typically, substrate 54 comprises an insulator such as $SiO_2$.

Preferably, layer 52 is formed on substrate 54 by conventional high-vacuum techniques in conjunction with standard lithographic procedures, such as by sputtering or electron beam deposition, or alternatively by any other means known in the art for forming a thin film on a substrate. Most preferably, substrate 54 is cleaned prior to deposition of layer 52, by methods known in the art. For example, when substrate 54 comprises quartz, it may be cleaned ultrasonically using a sequence of dilute hydrochloric acid then ethanol; preferably, layer 52 is then formed on the cleaned substrate by deposition at room temperature using an electron-beam evaporator at a pressure of approximately $10^{-8}$ Pa, and most preferably, a deposition rate for forming the layer is set to be approximately 4–5 nm/s, although the deposition rate may be significantly lower or higher than these values. In some preferred embodiments of the present invention, a protective layer 74 is deposited on an upper face 72 of layer 52, in order to protect layer 52. Layer 74 may be any convenient insulator, such as $SiO_2$.

By way of example, layer 52 is assumed to be generally rectangular in shape. It will be understood, however, that layer 52 may comprise substantially any shape, such as an elliptical or irregular shape.

Current carrying conductors 56 and 58 are attached to opposite sides 60 and 62 of layer 52, so that a current may be injected between sides 60 and 62. Voltage measuring conductors 64 and 66 are attached to opposite sides 68 and 70 of layer 52. The attachment of the current carrying and voltage measuring conductors may be performed by any means known in the art, such as utilizing chromium/gold pads as bonding pads between layer 52 and the conductors. In the event that protective layer 74 is overlaid on layer 52, contact windows for the pads are etched in the protective layer, preferably using a wet chemical etching agent such as buffered hydrofluoric acid.

Figure 4:
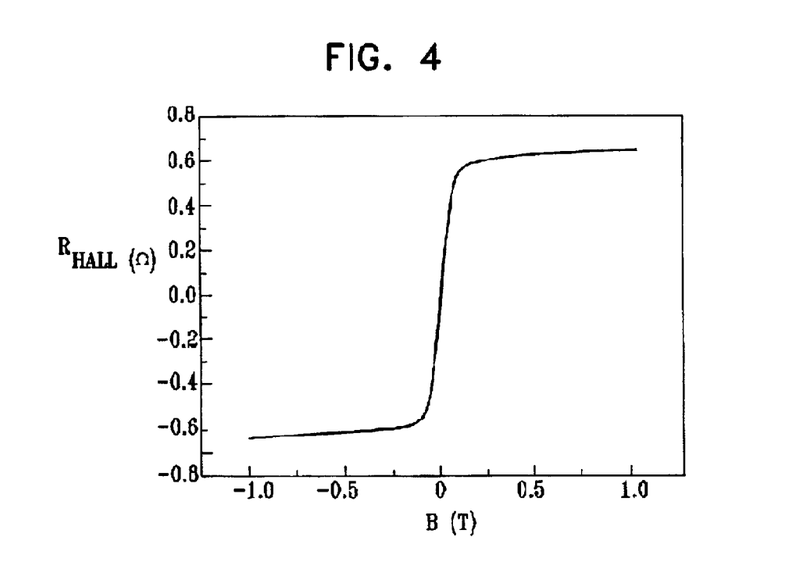
FIG. 4 is a graph of Hall resistance $R_{Hall}$ vs. magnetic field B for a sensor of the form described with reference to FIG. 3, according to a preferred embodiment of the present invention.

FIG. 4 is a graph of Hall resistance $R_{Hall}$ vs. magnetic field B, according to a preferred embodiment of the present invention. Values for the graph were determined when layer 52 comprised a nickel film, having a thickness t of 10 nm, which was deposited as described above with reference to FIG. 3, and when the sensor was operated at temperatures of the order of 290 K. In contrast to the nickel film of 100 nm thickness, described with reference to the graph of FIG. 2 in the Background of the Invention, the nickel film herein exhibited very low hysteresis, less than $5 \cdot 10^{-4}$ T. Furthermore, in its unsaturated sections sensor 50 has a slope, $$\frac{dR_{Hall}}{dB},$$

approximately equal to 10 Ω/T, and thus has substantially increased field sensitivity compared to the 100 nm thick film. Also in its unsaturated section, the graph of FIG. 4 has improved linearity compared to the graph of FIG. 2. The differences between the parameters of sensor 50, described above, and the corresponding parameters of the 100 nm thick nickel film described with reference to FIG. 2 are due to the increased relative contribution of scattering in the case of the 10 nm film.

Figure 5:
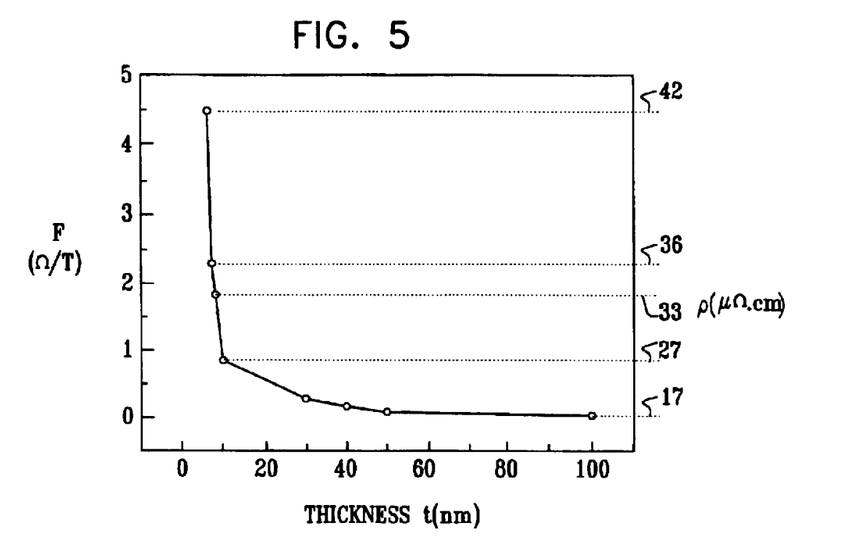
FIG. 5 is a graph of field sensitivity F and resistivity ρ vs. thickness t for a series of nickel films, according to a preferred embodiment of the present invention.

FIG. 5 is a graph of field sensitivity F and resistivity ρ vs. thickness t for a series of nickel films, according to a preferred embodiment of the present invention. The films were deposited as described above with reference to FIG. 3. The graph shows that as the thickness t decreases from 100 nm, there is a sharp increase in field sensitivity F for values of t in the region of 10 nm and below, corresponding to t being of the order of, or less than, a mean free path of electrons in the nickel film. At these threshold thicknesses surface scattering may become a significant factor in causing electrons in the nickel to scatter. The increase in field sensitivity F is reflected in an increase in resistivity ρ of the film as the thickness decreases. As may be observed from the graph, the resistivity ρ has a substantially constant value of approximately 17 μΩ.cm for thicknesses of the order of 40 nm and more, corresponding to the resistivity of bulk nickel. For thicknesses less than a threshold thickness of approximately 10 nm, the resistivity increases from the bulk resistivity by a factor greater than approximately 150%, according to the thickness of the film. Furthermore, as is shown in the graph, the resistivity is approximately 200% the bulk resistivity at a thickness of approximately 7 nm, and approximately 250% the bulk resistivity at a thickness of approximately 6 nm. It will be appreciated that at even smaller thicknesses, the resistivity increases correspondingly.

Thus, a thin film which has a measured resistivity greater than approximately 1.5 times the bulk resistivity of the film material has a correspondingly enhanced extraordinary Hall coefficient, compared to the extraordinary Hall coefficient of the bulk material. It will be appreciated by those skilled in the art that such films may be fabricated by a process known in the art, such as is described above, and the resistivity of the film may be measured during fabrication to form a thin film having an enhanced extraordinary Hall coefficient. Once formed, the thin film may be used as a magnetic field sensor.

Figure 6:
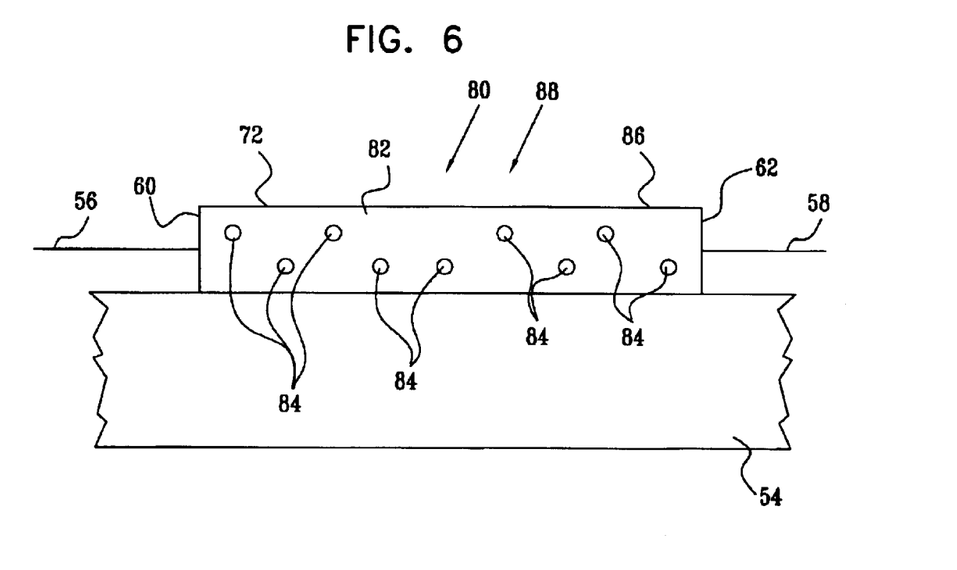
FIG. 6 is a schematic cross-section of a magnetic field sensor, according to an alternative preferred embodiment of the present invention.

FIG. 6 is a schematic cross-section of a sensor 80, according to an alternative preferred embodiment of the present invention. Apart from the differences described below, the operation of sensor 80 is generally similar to that of sensor 50 (FIG. 3), so that elements indicated by the same reference numerals in both sensors 50 and 80 are generally identical in construction and in operation. Sensor 80 is implemented in generally the same manner as sensor 50. Unlike sensor 50, sensor 80 comprises a layer 86 comprising ferromagnetic particles 84 embedded in a matrix 82 of non-ferromagnetic conductor, to form a thin film 88. For example, particles 84 are formed from cobalt, and matrix 82 is formed from platinum.

In forming layer 86, a volume ratio of ferromagnetic particles 84 to matrix 82 is set to be between two levels. A lower volume ratio level is approximately 0.05%. An upper volume ratio level corresponds to the volume ratio at which a ferromagnetic percolation threshold, where coupling between the grains increases to a level where the film behaves as a ferromagnet, is achieved. (The ferromagnetic percolation threshold is also known as the superparamagnetic to ferromagnetic transition.) The upper volume ratio is typically between approximately 15% and approximately 100%. Sensors such as sensor 80, fabricated as described hereinabove, have an enhanced extraordinary Hall coefficient compared to the bulk extraordinary Hall coefficient. The enhancement is due to scattering at interfaces between ferromagnetic particles 84 and the conducting material of matrix 82.

Hereinbelow follows a detailed description of a process for forming layer 86, according to a preferred embodiment of the present invention. Most preferably, layer 86 is formed by first depositing an approximately 5 nm layer of platinum on substrate 54, using an electron gun evaporator. Cobalt clusters having approximate diameters of 3 nm are then deposited, within a deposition chamber, on the platinum using a low-energy cluster beam deposition technique. Preferably, the technique comprises focussing a pulsed laser such as a titanium-samarium laser on a high purity cobalt target. As the laser is pulsed on, helium gas at a pressure of approximately 3.5 bar is synchronously injected into the deposition chamber. The gas achieves fast cooling of the plasma generated by the laser beam into nascent clusters, which become fixated after supersonic expansion from the deposition chamber via a nozzle.

A second layer of platinum, preferably of the order of 15 nm thick, is then deposited from the electron gun evaporator, so forming layer 86, which is effectively an array of cobalt particles embedded in a platinum matrix. The process described hereinabove gives an average inter-granular distance between the cobalt particles of approximately 37 nm, so that the matrix is strongly diluted, having a volume ratio of cobalt:platinum of approximately 0.1%. It will be appreciated that the above detailed description is one example of a process for producing an array of ferromagnetic clusters within a conducting non-ferromagnetic matrix. Other processes for producing an array of ferromagnetic clusters within a conducting non-ferromagnetic matrix, such as simultaneous co-deposition of immiscible ferromagnetic and non-magnetic components, will be apparent to those skilled in the art. All such processes are considered to be comprised within the scope of the present invention.

Figure 7:
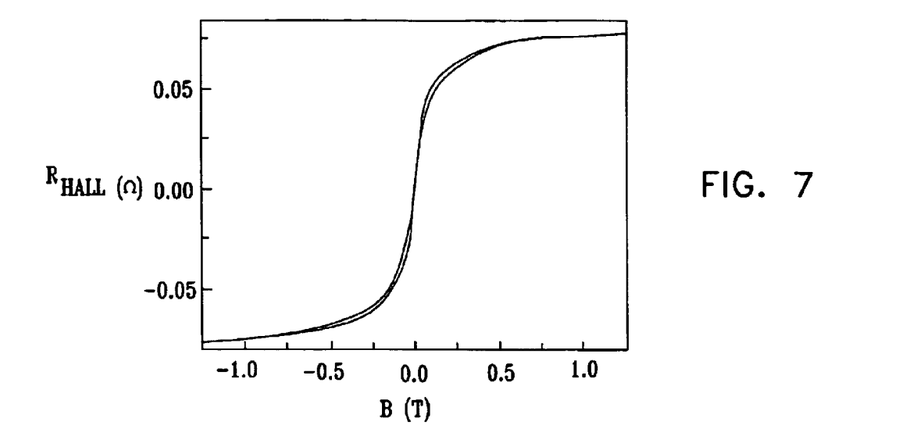
FIG. 7 is a graph of Hall resistance $R_{Hall}$ vs. magnetic field B for a thin film of ferromagnetic clusters in a conducting matrix, according to a preferred embodiment of the present invention.

FIG. 7 is a graph of Hall resistance $R_{Hall}$ vs. magnetic field B for a thin film of ferromagnetic clusters in a conducting matrix, according to a preferred embodiment of the present invention. Thin film 88 (FIG. 6) was produced according to the detailed description given above with reference to FIG. 6. The graph applies for temperatures of 77 K and above. Scattering by the cobalt clusters in the conducting matrix enhances an extraordinary Hall voltage averaged over the matrix volume. As is apparent from the graph, film 88 exhibits substantially no hysteresis, and effectively behaves as a super-paramagnet, enabling sensor 80 to operate efficiently. As is shown in an unsaturated section of the graph, sensor 80 has a slope, $$\frac{dR_{Hall}}{dB},$$

approximately equal to 0.5 Ω/T.

Figure 8:
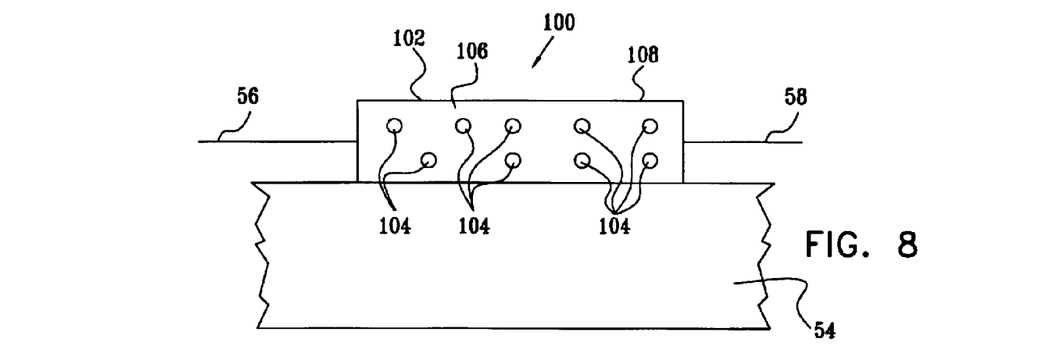
FIG. 8 is a schematic cross-section of a magnetic field sensor, according to a further alternative preferred embodiment of the present invention.

FIG. 8 is a schematic cross-section of a sensor 100, according to a further alternative preferred embodiment of the present invention. Apart from the differences described below, the operation of sensor 100 is generally similar to that of sensor 50 (FIG. 3), so that elements indicated by the same reference numerals in both sensors 50 and 100 are generally identical in construction and in operation. Sensor 100 is implemented in generally the same manner as sensor 50. Sensor 100 comprises a layer 102 which is in the form of insulating inclusions 104 embedded in a ferromagnetic matrix 106, and which is formed in substantially the same manner as described with reference to FIG. 3 for layer 52, to form a film 108. For example, inclusions 104 are formed from silicon dioxide, and matrix 106 is formed from nickel, and layer 102 is produced by co-depositing the nickel and silicon dioxide. Most preferably, a volume ratio of insulating inclusions to ferromagnetic matrix in the layer is set to be approximately 100% or less, so that a conductance percolation threshold, wherein the layer begins to conduct, is not breached, i.e., so that the layer conducts.

In forming layer 102, the volume ratio is adjusted above a threshold volume ratio where a resistivity of the layer is at least approximately 1.5 times larger than a bulk resistivity of the ferromagnetic matrix material. Thus, layer 102 has a correspondingly enhanced extraordinary Hall coefficient, compared to the extraordinary Hall coefficient of the bulk material.

Figure 9:
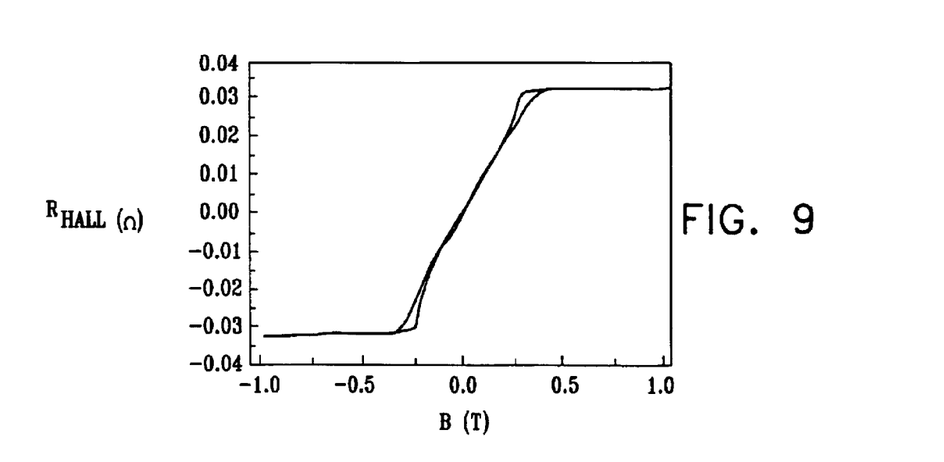
FIG. 9 is a graph of Hall resistance $R_{Hall}$ vs. magnetic field B for a film of the sensor of FIG. 8, according to a preferred embodiment of the present invention.

FIG. 9 is a graph of Hall resistance $R_{Hall}$ vs. magnetic field B for film 108, according to a preferred embodiment of the present invention. Film 108 is implemented substantially as described above for the example wherein layer 102 comprises silicon dioxide inclusions in a nickel matrix. The graph applies for temperatures of the order of room temperature. The presence of the insulating $SiO_2$ inclusions causes scattering at the interfaces with the inclusions, and thus enhances the extraordinary Hall effect. The graph shows that film 108 exhibits little hysteresis, enabling sensor 100 to operate efficiently as a magnetic field sensor. As is shown in an unsaturated section of the graph, sensor 100 has a slope, $$\frac{dR_{Hall}}{dB},$$

approximately equal to 0.08 Ω/T.

Returning to FIG. 3, in an alternative preferred embodiment of the present invention, layer 52 may be formed as a non-homogeneous film built from weakly coupled grains of conducting ferromagnetic material. Such non-homogeneous films are described in the article "Spin-dependent scattering in weakly coupled nickel films," by Gerber et al., referred to in the Background of the Invention. Because the grains formed are weakly coupled, there is increased scattering of electrons, so that the extraordinary Hall effect for films of this type is correspondingly enhanced.

In forming layer 52 as a weakly coupled non-homogeneous film, the film is formed by depositing ferromagnetic material so that a conductance percolation threshold is reached, i.e., so that a film thickness is sufficient for the film to conduct. The thickness of the film is set to be below a thickness corresponding to a ferromagnetic percolation threshold. In this case the film behaves as a super-paramagnet.

Preferably, for nickel deposited at approximately room temperature, a lower limit for the thickness, corresponding to the conductance percolation threshold, is approximately 3 nm, and an upper limit for the thickness, corresponding to the ferromagnetic percolation threshold, is approximately 100 nm.

Thin films such as those described above with reference to FIGS. 3, 6, and 8 may also be used as memory devices, as will be appreciated by those skilled in the art. For example, referring to layer 52 (FIG. 3), layer 86 (FIG. 6), and layer 102 (FIG. 8), each respective layer may be implemented to have perpendicular anisotropy at room temperature. For example, the layer may be implemented as a Co—Pt alloy. When formed to have perpendicular anisotropy, the layer is able to function as a memory device by virtue of the hysteresis inherent in the layer.

It will be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. A magnetic field sensor, comprising:
   an insulating substrate;
   a conductive thin film deposited on the substrate, the thin film comprising a material having an extraordinary Hall coefficient such that a resistivity of the thin film increases with decreasing film thickness below a threshold thickness at which the resistivity is substantially equal to 150% of a bulk resistivity of the material, and such that the film thickness of the thin film is no greater than the threshold thickness; and conductors coupled to the thin film for injecting a current into the film and measuring a voltage generated across the thin film responsive to the injected current.

2. A sensor according to claim 1, wherein the film thickness is no greater than the thickness at which the resistivity is substantially equal to 200% of the bulk resistivity.

3. A sensor according to claim 1, wherein the film thickness is no greater than the thickness at which the resistivity is substantially equal to 250% of the bulk resistivity.

4. A sensor according to claim 1, wherein the film thickness is set so that the conductive thin film has substantially no hysteresis.

5. A sensor according to claim 1, wherein the film is implemented to have substantially parallel anisotropy.

6. A sensor according to claim 1, wherein the thin film comprises a substantially homogeneous film comprising a ferromagnet.

7. A sensor according to claim 1, wherein the film thickness is less than approximately 10 nm.

8. A sensor according to claim 1, wherein the film thickness is less than approximately 6 nm.

9. A method for producing a thin film with an enhanced extraordinary Hall coefficient, comprising:

determining a bulk resistivity for a material comprising the thin film; and fabricating the thin film such that a resistivity of the thin film increases with decreasing film thickness below a threshold thickness at which the resistivity is substantially equal to 150% of the bulk resistivity, and such that the film thickness of the thin film is no greater than the threshold thickness.

10. A method according to claim 9, wherein fabricating the thin film comprises fabricating the film thickness so that the thin film has substantially no hysteresis.

* * * * *